United States Patent [19]

Bair

[11] Patent Number: 4,574,460
[45] Date of Patent: Mar. 11, 1986

[54] METHOD OF RELEASABLY SECURING A STATOR, METHOD OF RELEASABLY SECURING A CLAMPING DEVICE, METHOD OF ADJUSTING A WEDGE ANGLE, CLAMPING DEVICE, AND WEDGE DEVICE

[75] Inventor: Eugene C. Bair, Holland, Mich.

[73] Assignee: General Electric Company, Fort Wayne, Ind.

[21] Appl. No.: 627,824

[22] Filed: Jul. 5, 1984

[51] Int. Cl.$^4$ .......................... B23Q 7/00; B23B 5/22
[52] U.S. Cl. ......................................... 29/559; 279/50
[58] Field of Search .................... 279/43, 50; 29/559, 29/732, 733, 738

[56] References Cited

U.S. PATENT DOCUMENTS

| | | |
|---|---|---|
| 784,003 | 2/1905 | Hoegh . |
| 1,301,287 | 4/1919 | McMahon . |
| 2,363,889 | 11/1944 | Martin .................................. 279/50 |
| 2,363,890 | 11/1944 | Martin .................................. 279/50 |
| 2,479,076 | 8/1949 | Martin .................................. 279/50 |
| 2,810,585 | 10/1957 | Cracchiols ........................... 279/43 |
| 4,049,282 | 9/1977 | Yearsley .............................. 279/50 |
| 4,052,788 | 10/1977 | Hastings et al. ...................... 29/764 |

Primary Examiner—Mark Rosenbaum
Assistant Examiner—Steven Nichols
Attorney, Agent, or Firm—Joseph E. Papin

[57] ABSTRACT

A method of adjusting a wedge angle between a pair of wedge surfaces in a wedge device. The wedge device includes a housing, a pair of opposed walls therein with at least one of the opposed walls having a bifurcated wall section and with the other of the opposed walls and the bifurcated wall section defining the wedge surfaces, and an adjusting device. In practicing this method, the adjusting device is drivingly engaged with a part of the bifurcated wall section, and thereby the bifurcated wall section is deflected with respect to the other opposed wall so as to adjust the wedge angle between the wedge surfaces defined on the bifurcated wall section and the other opposed wall, respectively.

A wedge device, a clamping device, a method of releasably securing a clamping device, and a method of releasably securing a stator are also disclosed.

45 Claims, 10 Drawing Figures

METHOD OF RELEASABLY SECURING A STATOR, METHOD OF RELEASABLY SECURING A CLAMPING DEVICE, METHOD OF ADJUSTING A WEDGE ANGLE, CLAMPING DEVICE, AND WEDGE DEVICE

CROSS-REFERENCE TO RELATED APPLICATIONS

This application is related to the commonly assigned applications Ser. No. 563,765 now U.S. Pat. No. 4,485,126 and Ser. No. 563,766 concurrently filed on Dec. 21, 1983 which are respectively incorporated herein by reference.

FIELD OF THE INVENTION

This invention relates in general to apparatus utilized in the manufacture of dynamoelectric machines and in particular to a method of releasably securing a stator for a dynamoelectric machine on an arbor, a method of releasably securing a clamping device on an arbor, a method of adjusting a wedge angle between a pair of wedge surfaces in a wedge device, a wedge device and a clamping device.

BACKGROUND OF THE INVENTION

In the past, various different devices were utilized to chuck, clamp or position a stator onto an arbor carried by various different conveyor systems through a plurality of work stations of apparatus for impregnating winding means of the stator with a liquid adhesive material. For instance, the conveyor system of U.S. Pat. No. 3,782,325 provided a fork with three tines fitted within a bore of a stator to support it during its travel through the various work stations of the apparatus disclosed therein. However, without more support for the stator, it is believed that at least one disadvantageous or undesirable feature of such patented apparatus was that such stator may not have been accurately maintained in a position on the tines of the fork to permit the accurate disposition of the liquid adhesive material on the opposite end turn groupings of the winding means in the stator. In U.S. Pat. No. 2,572,515, opposite shaft ends of a rotor were supported on a pair of opposed pointed dowels on a fixture curved through the various work stations of the apparatus disclosed in such patent; however, it is believed that such apparatus may not be adaptable to stators. While the aforementioned patents are discussed herein merely to illustrate generally the apparatus to which the present invention is related, it is believed that there may be many of such apparatus too numerous to mention including those disclosed in applications Ser. No. 563,765 and Ser. No. 563,766 identified hereinbefore.

SUMMARY OF THE INVENTION

Among the several objects of the invention may be noted the provision of an improved clamping device, an improved wedge device, an improved method of adjusting a wedge angle between a pair of wedge surfaces in a wedge device, an improved method of releasably securing a clamping device on an arbor, and an improved method of releasably securing a stator for a dynamoelectric machine on an arbor which overcome the disadvantageous or undesirable features discussed hereinabove, as well as others, with respect to the prior art; the provision of such improved clamping device, wedge device and methods in which the degree of gripping engagement of the clamping device with the arbor may be fine tuned to compensate for wear; the provision of such improved clamping device, wedge device and methods in which the degree of gripping engagement of the clamping device with the arbor is adjustable thereby to insure the maintenance of an adequate gripping engagement force; the provision of such improved clamping device, wedge device and methods in which adjusting means is associated with the wedge device for quickly and easily adjusting the wedge angle between the wedge surfaces therein in order to attain the aforementioned fine tuning and the adequate gripping engagement force; the provision of such improved clamping device, wedge device and methods in which the clamping device is locked in its clamping position against axial displacement movement on the arbor; the provision of such improved clamping device, wedge device and methods in which the clamping device is quickly and easily releasably secured in its clamping position on the arbor and associated with a stator thereon so as to maintain the stator in a preselected located position on the arbor; and the provision of such improved clamping device, wedge device and methods in which a force no greater than a preselected value is resiliently transmitted against the stator in the preselected located position thereof from the clamping device, and if the stator is of the so-called loose lamination type, such resiliently transmitted force is effective to maintain compacted the loose laminations. These as well as other objects and advantageous features of the present invention will be in part apparent and in part pointed out hereinafter.

In general, a method is provided in one form of the invention for adjusting a wedge angle between a pair of wedge surfaces in a wedge device. The wedge device includes a housing, a pair of opposed walls on the housing with at least one of the opposed walls having a bifurcated wall section, the other of the opposed walls and the bifurcated wall section defining the wedge surfaces, and an adjusting device. In practicing this method, the adjusting device is drivingly engaged with a part of the bifurcated wall section, and thereby the bifurcated wall section is deflected with respect to the other opposed wall so as to adjust the wedge angle between the wedge surfaces defined on the other opposed wall and the bifurcated wall section, respectively.

Also in general and in one form of the invention, a wedge device has a housing, and a wall on the housing defines a wedge surface. A bifurcated wall section in the housing defines another wedge surface disposed generally in spaced apart opposed relation with the first named wedge surface, and adjusting means is movable in the housing for deflecting the bifurcated wall section thereby to adjust a wedge angle between the first named and another wedge surface, respectively.

Further in general, a method is provided in one form of the invention for releasably securing a clamping device in a clamping position about an arbor. The clamping device includes a pair of means adapted for relative movement, means in at least one of the resiliently urged means for receiving the arbor, split compression means associated with the receiving means and operable generally for gripping in engagement generally about the arbor and with the split compression means having a pair of opposite end sections, and a pair of wedge surfaces on the other of the relatively movable means. In the practice of this method, the clamping device is placed on the arbor, and the arbor is received in the receiving means therefor in the at least one relatively movable means. A force is exerted on one of the at least one relatively movable means and the other relatively movable means, and thereby the relative movement of by the relatively movable means is effected toward the clamping position of the clamping device. The wedge surfaces on the other relatively movable means are moved into wedging engagement with the opposite end sections of the split compression means in response to the relative movement of the relatively movable means, respectively, and thereby the operation of the clamping means into the gripping engagement thereof about the arbor is effected to releasably secure the clamping device in its clamping position about the arbor.

Still further in general and in one form of the invention, a clamping device has a pair of means adapted for relative movement. At least one of the relatively movable means includes a bore therein, and an aperture extending through the at least one relatively movable means intersecting with the bore therein. Compression means disposed in part within the bore of the at least one relatively movable means is operable generally for compressive movement with respect thereto, and the compression means includes a pair of opposite end sections extending through the aperture exteriorly of the at least one relatively movable means. The other of the relatively movable means includes means for wedging engagement with the opposite end sections of the compression means to effect the compressive movement thereof with respect to the at least one relatively movable means in response to the movement of the other relatively movable means relative to the at least one relatively movable means.

Yet in general, a method is provided in one form of the invention for releasably securing a stator for a dynamoelectric machine in a preselected position on a means for mounting the stator including a releasable clamping device having resiliently urged means thereon for exerting a force. In this method, the stator is arranged generally in coaxial relation with the mounting means, and the stator is supported in the preselected position thereof on the mounting means against axial movement thereon in one direction. The clamping device is associated in releasable gripping engagement with the mounting means, and the resiliently urged means is biased between the clamping device and the stator to exert the force against the stator thereby to retain the stator generally against axial displacement in another direction opposite the one direction from the preselected position thereof on the mounting means.

BRIEF DESCRIPTION OF THE DRAWINGS

Corresponding reference characters refer to corresponding parts throughout the several views of the drawings.

The exemplifications set out herein illustrate the preferred embodiments of the invention in one form thereof, and such exemplifications are not to be construed as limiting either the scope of the disclosure or the scope of the invention in any manner.

DETAILED DESCRIPTION OF THE PREFERRED EMBODIMENTS

Figure 1:
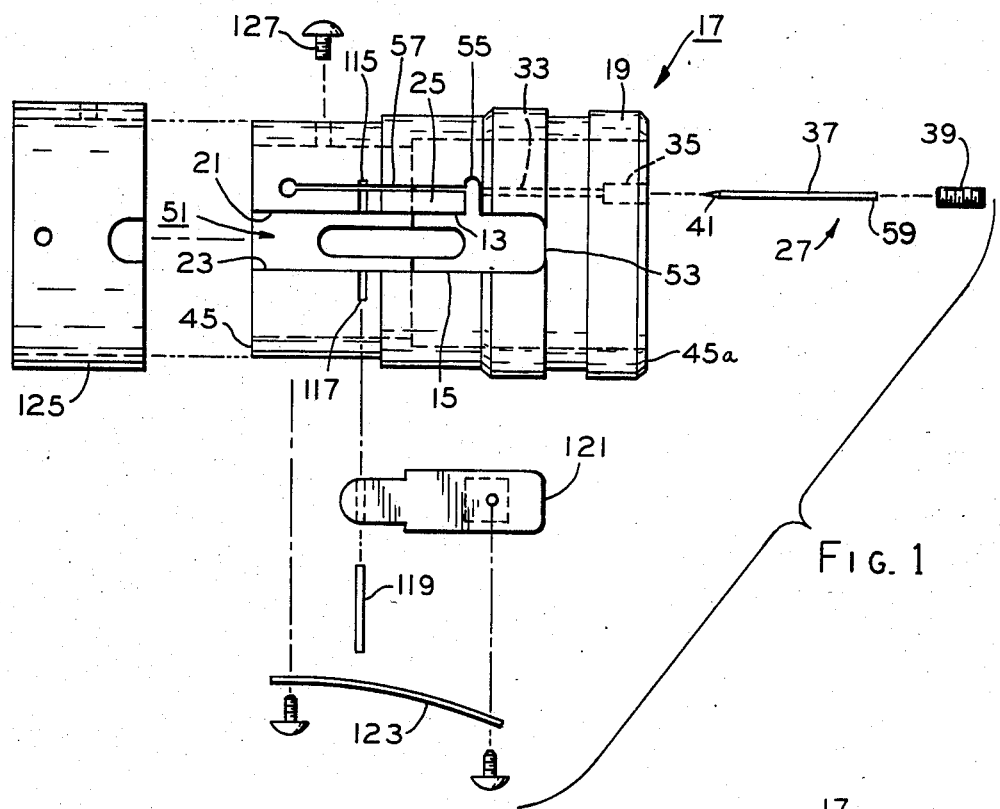
FIG. 1 is an exploded top elevational view of a wedge device in one form of the invention and illustrates principles which may be practiced in a method of adjusting a wedge angle between a pair of wedge surfaces in a wedge device also in one form of the invention.
Figure 2:
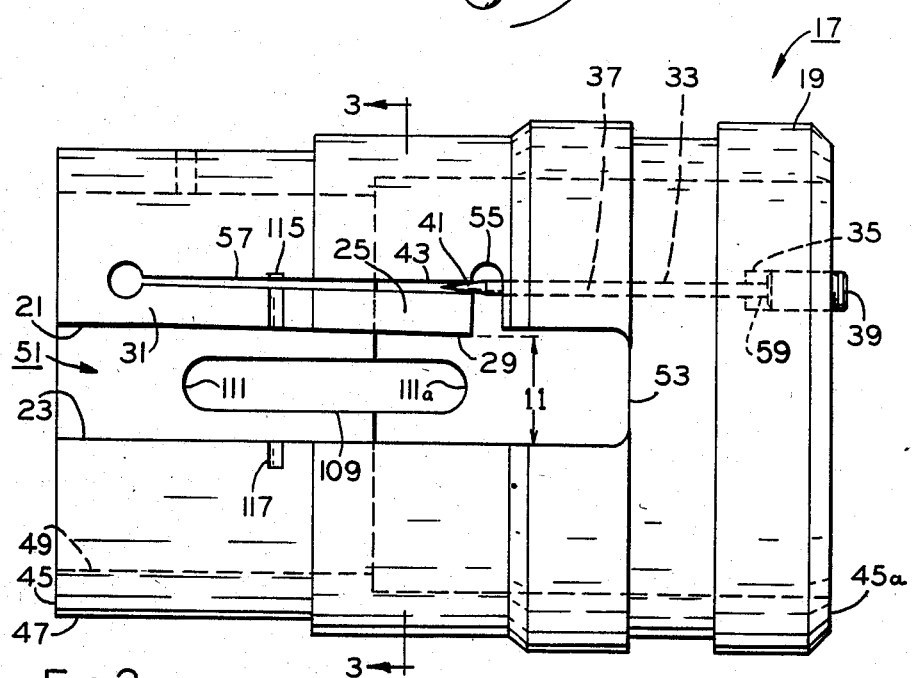
FIG. 2 is generally the same as FIG. 1 but showing adjusting means associated with the wedge device to effect the adjustment of the wedge angle between the wedge surfaces.
Figure 3:
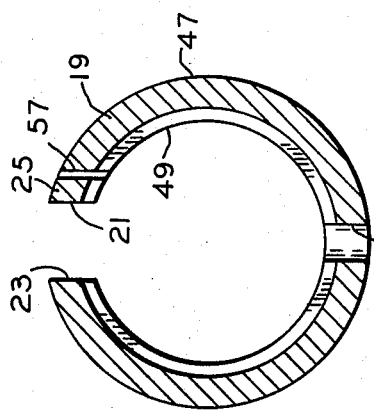
FIG. 3 is a sectional view taken along line 3—3 in FIG. 2.

Referring to the drawings in general, there is illustrated a method in one form of the invention for adjusting a wedge angle 11 between a pair of wedge surfaces 13, 15 in a wedge device 17 (FIGS. 1–3). Wedge device 17 includes a housing or wedge sleeve 19 having a pair of opposed walls 21, 23 thereon with opposed wall 21 having a bifurcated wall section 25 defining with opposed wall 23 the wedge surfaces 13, 15, respectively, and an adjusting device 27 (FIGS. 1 and 2). In the practice of this method, adjusting device 27 is drivingly engaged with a part of bifurcated wall section 25, and thereby the bifurcated wall section is deflected or levered with respect to opposed wall 23 so as to adjust wedge angle 11 between wedge surfaces 13, 15 defined on the bifurcated wall section and opposed wall 23, respectively (FIG. 3).

More particularly and with specific reference to FIGS. 1–3, wedge sleeve 19 has a generally annular cylindric configuration and may be formed of any suitable material having desired strength and resiliency properties. Bifurcated wall section 25 has a free end portion 29 and another end portion 31 generally opposite thereto which is integrally formed with wedge sleeve 19, and a pair of stepped passages 33, 35 are provided in the wedge sleeve with the larger stepped passage 35 being at least in part threaded.

An adjusting pin 37 of adjusting device 27 is inserted into stepped passages 33, 35 in wedge sleeve 19 so as to extend through smaller stepped passage 33, and an adjusting screw 39 of the adjusting device is threadedly engaged within larger stepped passage 35. Adjusting screw 39 is threadedly adjusted or turned by a suitable tool, such as a screw driver or the like for instance, in larger stepped passage 35, and thereby adjusting pin 37 is generally axially moved in smaller stepped passage 33 being abutted in engagement with the adjusting screw. In this manner, a wedge end or end portion 41 of adjusting pin 37 is driven, wedged or adjustably moved into wedging engagement between free end portion 29 of bifurcated wall section 25 and a confronting part 43 of wedge sleeve 19 adjacent thereto. In response to this wedging engagement of adjusting pin 37 between bifurcated wall section 25 and confronting part 43 on wedge sleeve 19, the bifurcated wall section is displaced, pivoted or levered generally about its opposite end portion 31 integrally connected with the wedge sleeve toward an adjusted position with respect to opposed wall 23 of the wedge sleeve. Thus, upon the pivoted displacement of bifurcated wall section 25, the bifurcated wall section is adjustably moved toward opposed wall 23, and thereby wedge angle 11 between wedge surfaces 13, 15 defined on the bifurcated wall section and opposed wall 23, respectively, is adjusted.

With reference again to the drawings in general and recapitulating at least in part with respect to the foregoing, wedge device 17 in one form of the invention includes wedge sleeve 19, opposed wall 23 thereon defining wedge surface 15, and bifurcated wall section 25 of the wedge sleeve defining wedge surface 13 and disposed generally in spaced apart opposed relation with opposed wall 23 (FIG. 1). Adjusting means or adjusting device 27 is adjustably movable in wedge sleeve 19 for deflecting bifurcated wall section 25 thereby to adjust wedge angle 11 between wedge surfaces 13, 15, respectively (FIG. 2).

More particularly and with specific reference to FIGS. 1-3, wedge sleeve 19 has a pair of opposite ends or end portions 45, 45a interposed between a pair of generally radially spaced apart outer and inner circumferential surfaces 47, 49 with inner circumferential surface 49 defining a bore or stepped bore which extends generally axially through the wedge sleeve intersecting with the opposite end portions thereof, respectively. A slot, such as an aperture or generally elongate opening 51 or the like for instance, in wedge sleeve 19 extends generally axially thereof and includes opposed walls or sidewalls 21, 23 which intersect with opposite end portion 45 of the wedge sleeve and also with outer and inner circumferential surfaces 47, 49 thereof, and an end or cross wall 53 of the elongate opening is spaced generally axially between opposite end portions 45, 45a of the wedge sleeve so as to intersect both with the outer and inner circumferential surfaces thereof and the opposed sidewalls in the elongate opening, respectively. A cross-slot 55 is provided in wedge sleeve 19 intersecting with outer and inner circumferential surfaces 47, 49 thereof and also with opposed sidewall 21 in elongate opening 51 generally adjacent cross wall 53 thereof, respectively. Another slot or slit 57 in wedge sleeve 19 extends generally in parallel and adjacent spaced relation with at least a part of sidewall 21 in elongate opening 51, and the slot intersects with outer and inner circumferential surfaces 47, 49 of the sleeve and also with cross-slot 55 therein. Thus, it may be noted that cross-slot 55 and slot 57 in wedge sleeve 19 define bifurcated wall section 25 on the wedge sleeve which includes a part of opposed sidewall 21 of elongate opening 51, and as previously mentioned wedge surfaces 13, 15 are defined in opposed relation on the bifurcated wall section and sidewall 23 opposed therewith in the elongate opening. Stepped passages 33, 35 in wedge sleeve 19 are arranged generally in aligned relation with slot 55, and smaller stepped passage 33 intersects with cross-slot 55 while larger stepped passage 35 intersects with opposite end portion 45a of the wedge sleeve. Adjusting pin 37 is slidably received in smaller stepped passage 33 with wedge end 41 of the adjusting pin extending through cross-slot 55 into the wedging engagement thereof between bifurcated wall section 25 at least generally adjacent free end portion 29 thereof and confronting part 43 of the wedge sleeve adjacent the bifurcated wall section, as previously mentioned, and an abutment end 59 opposite the wedge end of the adjusting pin extends generally coaxially into larger stepped passage 35 into driven or abutting engagement with adjusting screw 39 threadedly received therein. As previously discussed, adjusting screw 39 is adjustably movable to drive adjusting pin 37 and effect the levered deflection of bifurcated wall section 25 with respect to opposed sidewall 23 in elongate opening 51 thereby to adjust wedge angle 11 between wedge surfaces 13, 15 defined on the bifurcated wall section and opposed sidewall 23, respectively.

Figure 4:
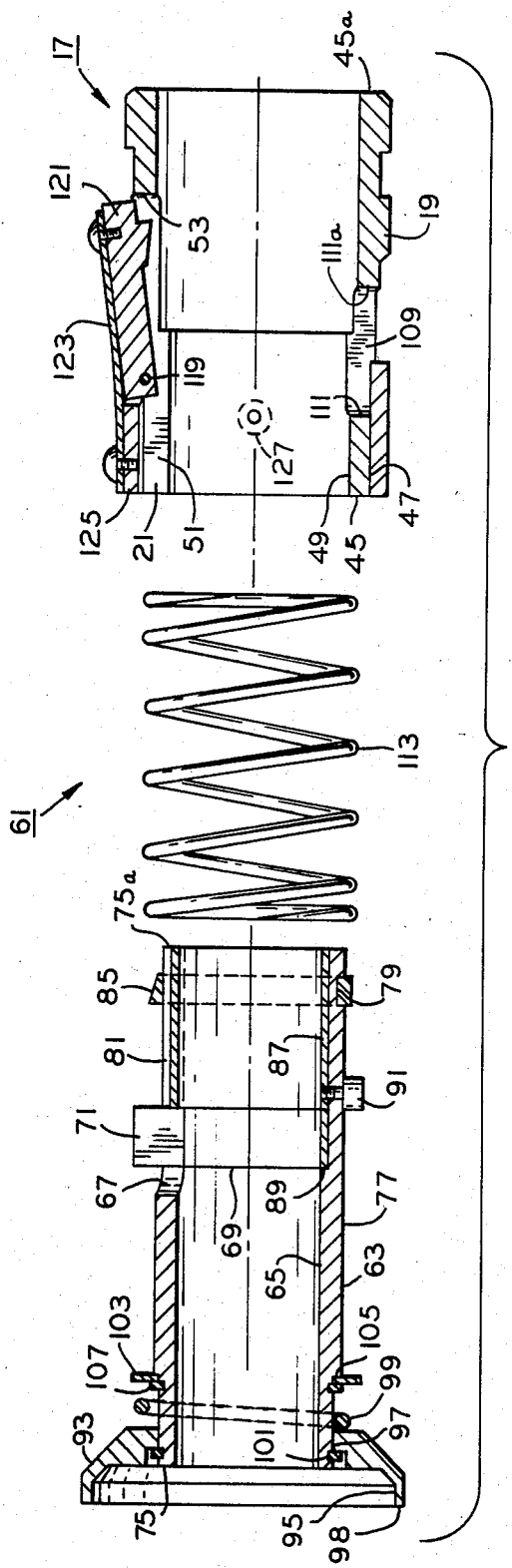
FIG. 4 is a partial exploded sectional view of a clamping device in one form of the invention which includes the wedge device of FIG. 1.
Figure 5:
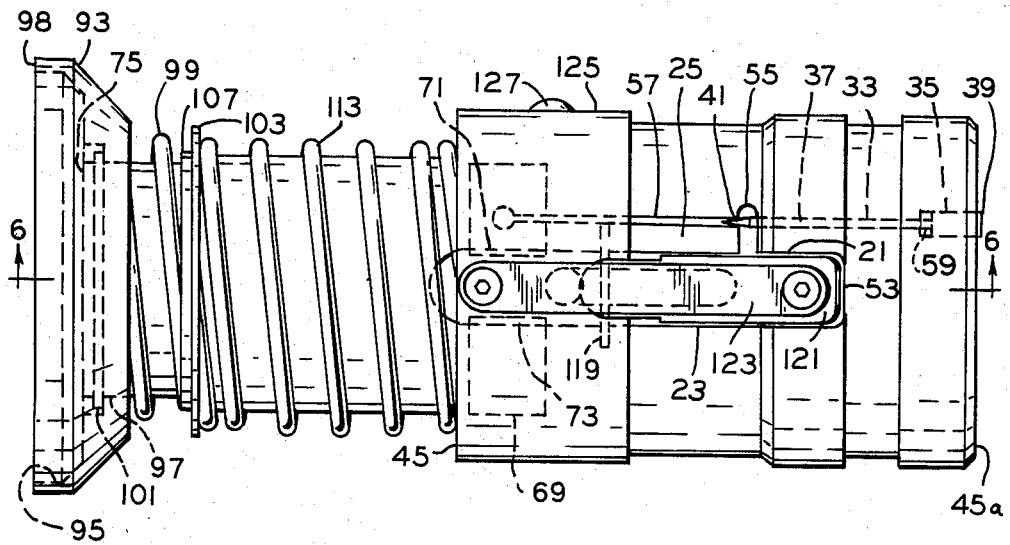
FIG. 5 is a top elevational view of the clamping device of FIG. 4.
Figure 6:
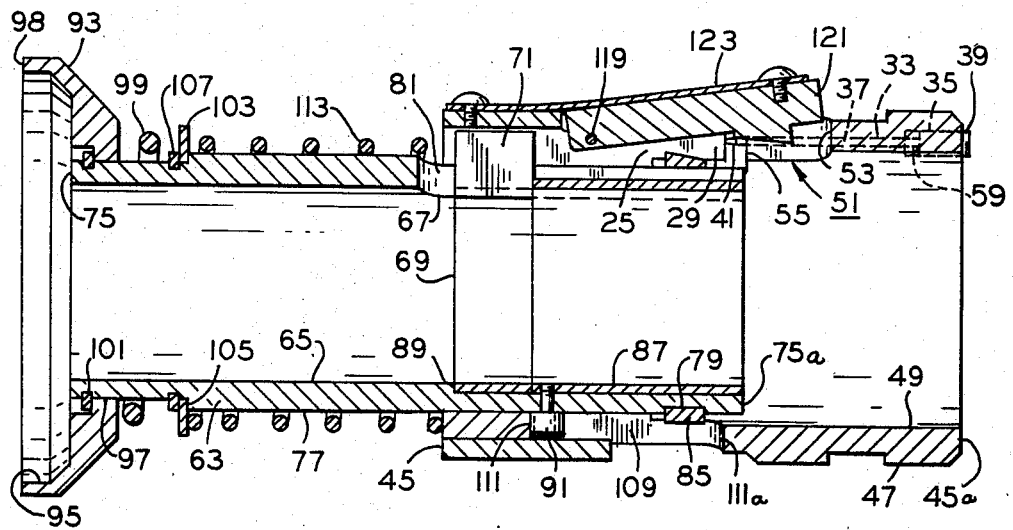
FIG. 6 is a sectional view taken along line 6—6 in FIG. 5.
Figures 7, 8:
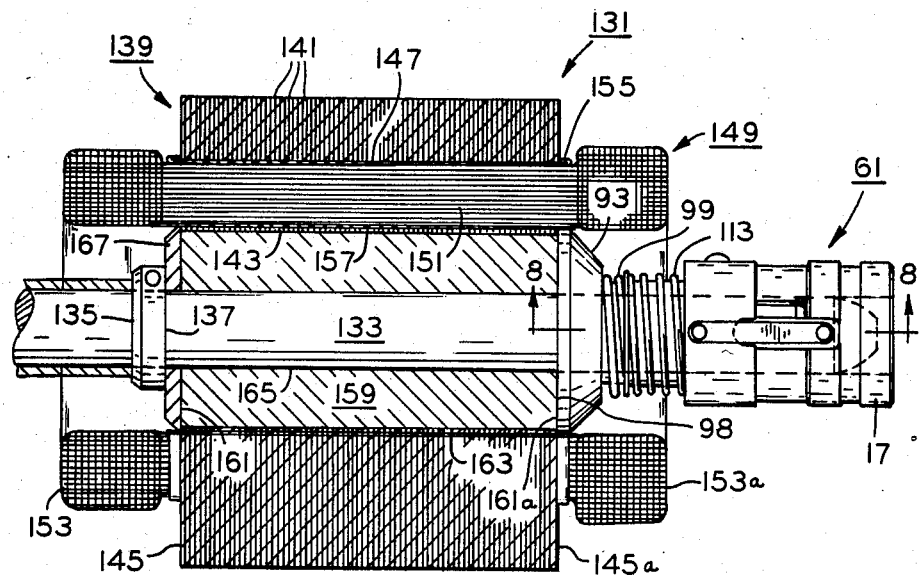
FIG. 7 is a partial sectional view illustrating principles which may be practiced in a method of releasably securing a clamping device on an arbor and a method of releasably securing a stator on an arbor in one form of the invention, respectively.
FIG. 8 is a sectional view showing the clamping device in the clamping position thereof.

With reference again to the drawings in general and again recapitulating at least in part with respect to the foregoing, there is shown in one form of the invention a clamping device 61 having a pair of means or members, such as wedge sleeve 19 and a mounting or slide sleeve 63 or the like for instance, adapted for relative movement, and relatively movable means or slide sleeve 63 includes a bore or stepped bore 65 therein and an aperture, such as a slot, aperture or elongate opening 67 or the like for instance, extending through slide sleeve 63 intersecting with bore 65 thereof (FIGS. 4-8). Compression means, such as a split compression ring or clamp 69 or the like for instance, disposed in part within bore 65 of sleeve 63 is operable generally for compressive movement with respect to the bore, and the compression means or split compression ring includes a pair of adjacently arranged opposite end sections 71, 73 which extend through elongate opening 67 exteriorly of the slide sleeve, respectively (FIGS. 4-6). Relatively movable means or wedge sleeve 19 includes means, such as for instance bifurcated wall section 25 and opposed sidewall 23 in elongate opening 51 of wedge sleeve 19, for wedging engagement with opposite end sections 71, 73 of split compression ring 69 to effect the compressive movement thereof with respect to bore 65 of slide sleeve 63 in response to the movement of wedge sleeve 19 relative to slide sleeve 63 (FIGS. 7 and 8).

More particularly and with specific reference to FIGS. 4-8, slide sleeve 63 of clamping device 61 has a generally annular cylindric configuration and may also be formed from a suitable material having the desired physical properties. Slide sleeve 63 includes a pair of opposite end portions 75, 75a which are interposed between or intersect with a pair of generally radially spaced apart inner and outer circumferential surfaces 65, 77, respectively, with the inner circumferential surface defining aforementioned bore 65 in the slide sleeve, as best seen in FIGS. 4-6. A groove 79 in slide sleeve 63 extends generally about outer circumferential surface 77 generally adjacent opposite end portion 75a of the slide sleeve, and elongate opening 67 in the slide sleeve includes a pair of generally axially extending opposed sidewalls 81, 83 which intersect with inner and outer circumferential surfaces 65, 77 and opposite end portion 75a of the sleeve while also extending through a part of the groove therein. A stop or abutment, such as for instance split retainer ring 85 or the like for instance, is seated or disposed in groove 79 and extends beyond outer circumferential surface 77 of the sleeve for purposes to be discussed in greater detail hereinafter. Split compression ring 69 may be formed of any suitable material having the desired physical properties of strength and resiliency, and the resiliency of the split compression ring in its at-rest position within bore 65 of slide sleeve 63 urges opposite end sections 71, 73 thereof toward seated or abutting engagement against opposed sidewalls 81, 83 in elongate opening 67 of sleeve 63. A retainer, such as a sleeve 87 or the like for instance, is received in inner circumferential surface 65 of sleeve 63 in engagement with split compression ring 69 to maintain it against displacement from a seat, such as an annular shoulder 89 or the like for instance, provided therefor in the inner circumferential surface of the sleeve. A position stop, such as a stud 91 or the like for instance, is threadedly received in sleeve 63 and retainer 87 thereby to maintain the retainer against displacement from its retaining position with respect to split compression ring 69 within inner circumferential surface 65 of the sleeve, and as discussed in greater detail hereinafter, the stud extends beyond outer circumferential surface 77 of the sleeve generally diametrically opposite elongate opening 67 therein.

Resiliently urged means, such as a generally annular cup 93 or the like for instance, has a stepped opening or bore 95, 97 extending generally axially therethrough, and a generally annular lip or abutment 98 is provided on the free end of the cup generally about the larger stepped opening 95 therethrough. Smaller stepped opening 97 in cup 93 is slidably received about outer circumferential surface 77 of sleeve 63 adjacent opposite end portion 75 thereof, and the cup is urged by resilient means, such as a spring 99 or the like for instance, into displacement preventing engagement with a retainer or abutment, such as a snap ring 101 for instance, seated in the outer circumferential surface of the sleeve adjacent opposite end portion 75 thereof. Spring 99 is also biased into engagement with a spring retainer 103 maintained in abutment with an annular shoulder 105 provided in outer circumferential surface 77 about slide sleeve 63 by another retainer, such as a snap ring 107 or the like, seated therein. Thus, it may be noted that cup 93 and spring 99 are associated in caged relation with slide sleeve 63 being caged thereon between snap ring 101 and spring retainer 103 thereby to define the at-rest position of the resiliently urged means.

As previously mentioned, slide sleeve 63 and wedge sleeve 19 of wedge device 17 are arranged in part in telescoping relation with each other; therefore, inner circumferential surface 49 of wedge sleeve 19 is received at least in part in sliding engagement about outer circumferential surface 77 of slide sleeve 63. In this telescoping association of wedge and slide sleeves 19, 63, it may be noted that position stop 91 of slide sleeve 63 is slidably received in a generally axially extending, lost motion defining or position slot 109 provided in wedge sleeve 19 generally diametrically opposite elongate opening 51 therein Position slot 109 extends through wedge sleeve 19 intersecting with outer and inner circumferential surfaces 47, 49 thereof, and the position slot has a pair of opposite abutment ends 111, 111a for lost motion engagement with position stop 91 upon the relative movement of wedge and slide sleeves 19, 63, as discussed hereinafter. Resilient means, such as a spring 113 or the like for instance, is biased between spring retainer 103 on slide sleeve 63 and opposite end portion 45 of wedge sleeve 19 thereby to resiliently urge or bias the sleeves in opposite axial directions and effect the interconnection or abutting engagement of abutment end 111 of position slot 109 with position stop 91 when the wedge and slide sleeves are in the respective at-rest positions thereof. Of course, it may be noted that the abutment between position stop 91 on slide sleeve 63 with opposite abutment end 111 of position slot 109 in wedge sleeve 19 not only obviates the displacement of the sleeves from their telescopic association but also cages the compressive force of spring 113 between the sleeves. Further, it may also be noted that the sliding or locating association of position stop 91 on slide sleeve 63 within position slot 109 in wedge sleeve 19 is effective to generally obviate rotational displacement of the sleeves with respect to each other so as to maintain elongate openings 51, 67 in the sleeves generally in both axial and radial alignment or aligned relation with each other. With elongate openings 51, 67 in sleeves 19, 63 so maintained in the axial and radial alignment thereof, it may be further noted that opposite end sections 71, 73 of split compression ring 69 extend into elongate opening 51 in wedge sleeve 19 adjacent opposed sidewalls 21, 23 thereof so as to be positioned for wedging engagement with wedge surfaces 13, 15 in wedge sleeve 19 upon the operation of clamping device 61, as discussed in detail hereinbelow.

As best seen in FIGS. 1 and 4, wedge sleeve 19 is provided with a pair of aligned journaling grooves 115, 117 intersecting with opposed sidewalls 21, 23 of elongate opening 51 in the wedge sleeve, and opposite end portions of a pivot pin 119 which extends generally transversely across the elongate opening are received or journaled in the journaling grooves, respectively. A locking dog or detent 121 is pivotally supported on pivot pin 119 so as to be pivotally movable in part through elongate opening 51 for locking engagement with stop 85 on sleeve 63, as discussed in detail hereinafter. To complete the description of clamping device 61, a leaf-type spring 123 is secured to detent 121 thereby to pivotally urge the detent toward an at-rest position, and the leaf-type spring is also secured to a means for supporting it, such as a ring 125 or the like for instance, which is received about outer circumferential surface 47 of sleeve 19 and secured thereto by suitable means, such as a screw 127 or the like for instance. While locking dog 121 is illustrated as being pivotally arranged on pivot pin 119 in wedge sleeve 19, it is contemplated that various other locking dogs having different configurations and pivotally associated in different manners with the wedge sleeve may be utilized within the scope of the invention so as to meet at least some of the objects thereof.

With reference still further to the drawings in general and recapitulating at least in part with respect to the foregoing, there is illustrated in one form of the invention a method of releasably securing a work piece, such as a stator 131 for a dynamoelectric machine (not shown) or the like for instance, in a preselected position on a means, such as for instance a mounting arbor or a shaft 133 or the like, for mounting or supporting the stator and including releasable clamping device 61 having resiliently urged means or cup 93 thereon for exerting a force (FIGS. 4–8). In the practice of this method, stator 131 is arranged generally in coaxial relation with the mounting means or shaft 133, and the stator is supported in the preselected position thereof on the shaft against axial movement thereon in one direction (FIG. 7). Clamping device 61 is associated in releasable gripping engagement with shaft 133, and resiliently urged means 93 is biased between the clamping device and stator 131 to exert the force against the stator thereby to retain the stator generally against axial displacement or movement in another direction opposite the one direction from the preselected position thereof on the shaft (FIGS. 6-8).

More particularly and with specific reference to FIGS. 7 and 8, shaft 133 is of a type which may be utilized for movement through the various work stations in the apparatus disclosed in the aforementioned applications Ser. No. 563,765 and Ser. No. 563,766, and if a more detailed discussion of such apparatus and/or its operation is desired, reference may be had to such applications. Shaft 133 has a stop or generally radially extending collar 135 with a locating surface 137 thereon defining the preselected position of stator 131 on shaft 133, and the collar is predeterminately located or positioned on the shaft by suitable means well known to the art; however, it is contemplated that such collar may, if desired, be integrally formed with the shaft within the scope of the invention so as to meet at least some of the objects thereof.

Stator 131 has a loose wound core 139 with a plurality of laminations 141 formed of a generally thin ferromagnetic material and arranged or aligned generally in an axially extending stack thereof, and a bore 143 defined by the laminations extends generally axially through the core between a pair of opposite end faces 145, 145a thereof. Laminations 141 also define a plurality of slots 147 extending generally axially between opposite end faces 145, 145a of core 139 and intersecting with bore 143 of the core generally radially thereabout. Loose wound core 139 also includes winding means 149 having a plurality of coils 151 received in slots 147 of the core with a pair of generally opposite annular groupings 153, 153a of coil end turns disposed adjacent opposite end faces 145, 145a of the core and extending generally about bore 143 therein, respectively. Of course, suitable insulation, such as for instance a plurality of slot liners 155 or the like of a dielectric material, may be associated with slots 147 of core 139 thereby to electrically insulate coils 151 of winding means 149 in the slots from the core, and suitable means, such as a plurality of slot wedges 157 or the like for instance, may also be associated with the core for retaining the coils of the winding means against displacement from the slots toward bore 143 of the core, respectively. While core 139 is illustrated as having individual laminations 141 formed into the stack thereof for purposes of disclosure, it is contemplated that other cores of different constructions and different components, such as for instance a continuous strip of generally thin ferromagnetic material edgewise and helically wound into a core, may be utilized within the scope of the invention so as to meet at least some of the objects thereof. If a more detailed discussion with respect to the assembly of loose wound stator 133 or its construction is desired, reference may be had to the aforementioned application Ser. No. 563,766.

A generally annular cylindric expansible sleeve 159 has a pair of opposite end portions 161, 161a interposed between a pair of generally radially spaced apart outer and inner circumferential surfaces 163, 165, respectively, and a flange or locating abutment 167 integral with the expansible sleeve extends generally radially beyond outer circumferential surface 163 of the expansible sleeve at least generally adjacent opposite end portion 161 thereof. Expansible sleeve 159 is formed of a metal, such as aluminum or the like for instance, having a coefficient of expansion greater than that of the material from which core 139 is formed, and if desired, the sleeve may be anodized to provide it with an aluminum oxide surface or coating. However, while the coefficients of expansion of the metals utilized in shaft 133 and expansible sleeve 159 are discussed herein as being different for purposes of disclosure, it is contemplated that such coefficients may be at least generally the same and that such a sleeve may be integrally formed with the shaft within the scope of the invention so as to meet at least some of the objects thereof. If a more detailed discussion of expansible sleeve 159 and/or its operational characteristics as utilized with a stator and shaft, such as those shown herein for instance, reference may be had to the aforementioned application Ser. No. 563,766 and U.S. Pat. No. 3,845,547 issued Nov. 5, 1974 to Hugh B. Reynolds which patent is incorporated by reference herein.

In the assembly of core 139 and expansible sleeve 159, an operator arranges or associates the core and the expansible sleeve generally in coaxial relation with each other, and at least a part of outer circumferential surface 163 of the expansible sleeve is slidably received in engagement within bore 143 of the core. Upon this coaxial arrangement of core 139 and expansible sleeve 159, a part of opposite end face 145 of the core generally about bore 143 therein is seated or abutted against locating flange 167 on the expansible sleeve. With core 139 and sleeve 159 in their coaxial relation, the sleeve is placed or arranged generally in coaxial relation with shaft 133, and inner circumferential surface 165 of the sleeve is slidably received in engagement about the shaft. When sleeve 159 is so received on shaft 133, opposite end portion 161 of the sleeve is abutted or seated in locating engagement against locating surface 137 of collar 135 on the shaft, and in this manner, stator 131 is retained against axial movement or displacement on the shaft in the aforementioned one direction, i.e., axially toward the collar. It may be noted that when opposite end face 145 of core 139 is located against flange 167 of expansible sleeve 159 and opposite end portion 161 of the expansible sleeve is located against locating surface 137 of collar 135 on shaft 133, stator 131 is supported in the preselected position thereof on the shaft generally in coaxial relation therewith.

In the assembly of clamping device 61 with shaft 133 and stator 131 and with the stator disposed in its assembly position on the shaft, assume that the component parts of the clamping device are in the at-rest positions thereof, as previously discussed. To effect this assembling, the operator slidably moves bore 65 in slide sleeve 63 of the clamping device into engagement about the shaft, and thereby the shaft is received or passed through split compression ring 69 disposed about bore 65 within sleeve 63, as best seen in FIG. 8. As clamping device 61 is so placed on shaft 133, abutment lip 98 on cup 93 is moved into abutting or seating engagement with opposite end face 145a of core 139 generally about bore 143 thereof. At least upon the seating of cup 93 against opposite end face 145a of core 139, the operator may conjointly depress leaf spring 123 and locking dog 121 on wedge sleeve 19 thereby to pivotally move the locking dog about its pivot pin 119 toward a depressed position within elongate opening 51 of the wedge sleeve, as discussed in greater detail hereinafter. Generally upon this pivotal movement of locking dog 121 toward its depressed position, the operator also exerts or applies a force onto wedge sleeve 19 urging it axially on shaft 133 in the direction generally toward stator 131 in its preselected position thereon. It may be noted that the operator applied force so exerted onto wedge sleeve 19 is effective to move it relative to slide sleeve 63 compressing spring 113 between opposite end portion 45 of the wedge sleeve and spring retainer 103 carried on the slide sleeve thereby to transmit the operator applied force to the slide sleeve, and in response to the transmission of the operator applied force thereto, the slide sleeve is also relatively movable on shaft 133 toward opposite end face 145a of core 139, as best seen in FIG. 8. It may also be noted that the relative movement of both wedge sleeve 19 and slide sleeve 63, as discussed above, is opposed by the compressive force of spring 99 caged between cup 93 in its abutment with opposite end face 145a of core 139 and spring retainer 103 on the slide sleeve. Therefore, due to the caged relation of spring 99, it may be further noted that the compression of spring 99 between cup 93 and spring retainer 103 on slide sleeve 63 in response to its relative movement on shaft 133 is effective to transmit to core 139 through cup 93 only a predetermined part of the operator applied force exerted onto wedge sleeve 19. Since stator 131 is of the loose wound type, as previously mentioned, the operator applied force so transmitted onto core 139 by cup 93 not only effects axial compaction of laminations 141 of the core in the surface-to-surface engagement thereof but also serves to effect the abutment of opposite end face 145 of the core with flange 167 of expansible sleeve 159 and opposite end portion 161 thereof with locating surface 137 of collar 135 on shaft 133 thereby to insure the disposition of stator 131 in the preselected position thereof on the shaft.

Figure 9:
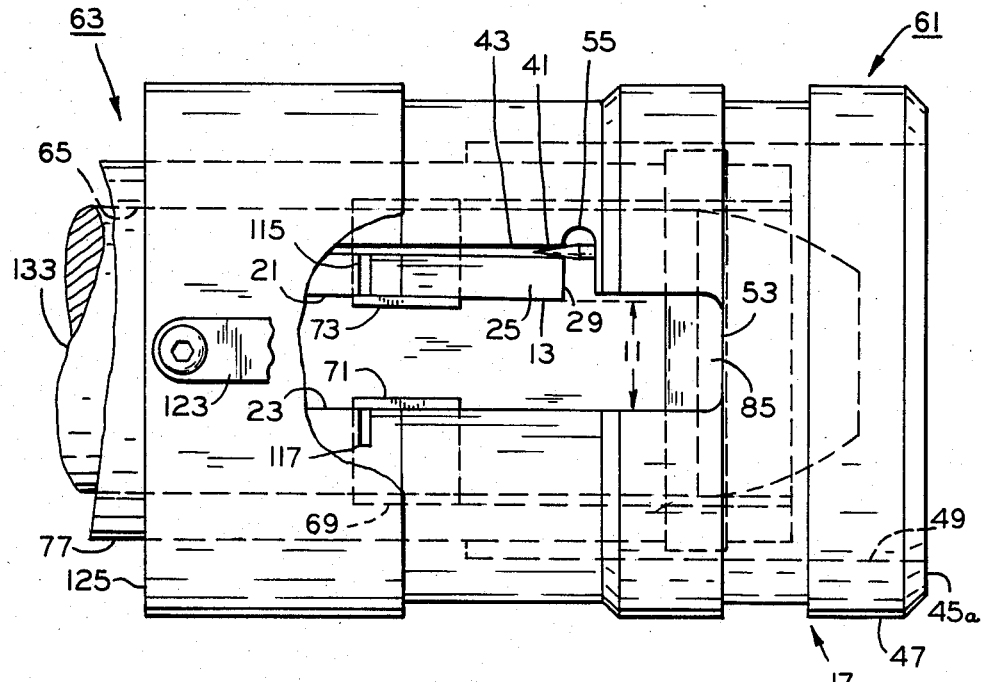
FIG. 9 is an enlarged partial view taken from FIG. 7 showing the wedging engagement between the wedge device and a split compression ring of the clamping device.

As previously mentioned, the relative movement between wedge sleeve 19 and slide sleeve 63 of clamping device 61 is accommodated by a predetermined range of lost motion therebetween which is defined by the travel of position stop 91 on the slide sleeve within position slot 109 between opposite abutment ends 111, 111a thereof in the wedge sleeve, as best seen in FIGS. 6 and 8. Therefore, upon the occurrence of the relative movement of wedge sleeve 19 and slide sleeve 63 in response to the operator applied force exerted thereon, opposed sidewalls 21, 23 of elongate opening 51 in wedge sleeve 19 are moved relative to opposite end sections 71, 73 of compressible split ring 67 thereby to effect the wedging engagement of wedge surfaces 13, 15 on bifurcated wall section 25 and opposed sidewall 23 of the wedge sleeve with the opposite end sections of the compressible split ring, as best seen in FIG. 9. In response to this wedging engagement, opposite end sections 71, 73 of compressible split ring 69 are, of course, wedged or squeezed toward each other thereby to effect the compression of the compressible split ring within bore 65 of slide sleeve 63 into gripping engagement about a part of shaft 133 received therethrough. Thus, when compressible split ring 69 is so wedged into gripping engagement about shaft 133, clamping device 61 is gripped in place in a clamping position about the shaft, and thereby stator 131 is retained against axial displacement from its preselected position on the shaft through the compressive force transmitted to core 139 by caged cup 93 and spring 99 on the slide sleeve.

As previously mentioned, locking dog 121 was urged by the operator into a depressed position within elongate opening 51 of wedge sleeve 19 when the applied force was exerted by the operator onto clamping device 61 to effect the relative movement of wedge sleeve 19 and slide sleeve 63 on shaft 133. Therefore, during the relative movement of wedge sleeve 19 and slide sleeve 63 toward the clamping position of clamping device 61 on shaft 131, the depressed locking dog 121 is conjointly moved with the wedge sleeve into elongate opening 51 axially past split ring stop 85 which is disposed in groove 79 of the slide sleeve so as to extend across elongate opening 51 therein. As depressed locking dog 121 is moved axially past split ring stop 85, momentary engagement therebetween occurs which, of course, urges the locking dog against the operator force maintaining it depressed. When the momentary engagement of locking dog 121 with split ring stop 85 is felt by the operator as the locking dog is moved axially therebeyond within elongate opening 51 of slide sleeve 63, the operator applied force exerted on wedge sleeve 19 may be released or eliminated. In response to the elimination of the operator applied force on wedge sleeve 19, the compressive force of spring 113 interposed between the wedge sleeve and slide sleeve 63 is effective to urge depressed locking dog 121 into locking or abutting engagement with split ring stop 85 on the slide sleeve thereby to releasably maintain or secure clamping device 61 against displacement from the clamping position thereof about shaft 133, as best seen in FIG. 8. Of course, when locking dog 121 of wedge sleeve 19 is so releasably interlocked with split ring stop 85 on slide sleeve 63, the operator applied force pivotally urging the locking dog toward its depressed position may also be released.

In order to release elamping device 61 from its clamping position on shaft 133, the operator applied force may be reapplied onto wedge sleeve 19 moving it axially against the compressive force of spring 113 biased between opposite end portion 45 of the wedge sleeve and spring retainer 103 on slide sleeve 63 thereby to cage spring 113 therebetween. Upon this caging of spring 113 between wedge sleeve 19 and slide sleeve 63, the compressive force of spring 113 acting to maintain the locking engagement between locking dog 121 on the wedge sleeve and split ring stop 85 on the slide sleeve is, of course, eliminated, and the resiliency of leaf spring 123 associated with the locking dog is effective to pivotally return the locking dog from its depressed position to its at-rest position thereby to interrupt the locking engagement of the locking dog and the split ring stop. Upon the disestablishment of the locking engagement between locking dog 121 and split ring stop 85, as discussed above, the compressive forces of springs 99, 113 are effective to return the component parts of clamping device 61 to their at-rest positions thereby to disengage wedge surfaces 13, 15 on bifurcated wall section 25 and opposed sidewall 23 of wedge sleeve 19 from opposite end sections 71, 73 of split compression ring 69. When the opposite end sections 71, 73 of split compressing ring 69 are so disengaged, the compressive force of the split compression ring effects its return to its at-rest position within bore 65 of slide sleeve 63 thereby to obviate the gripping engagement of the split compression ring about shaft 133. When the gripping engagement of split compression ring 69 about shaft 133 is so released, clamping device 61 may be removed from shaft 133 by the operator, and of course, stator 131 and expansible sleeve 159 may then also be removed from the shaft by the operator. While the loading and unloading of stator 131 and expansible sleeve 159 have been discussed herein as being accomplished by an operator, it is contemplated that suitable transfer or robotic equipment may be employed to effect such loading and unloading witin the scope of the invention so as to meet at least some of the objects thereof.

Figure 10:
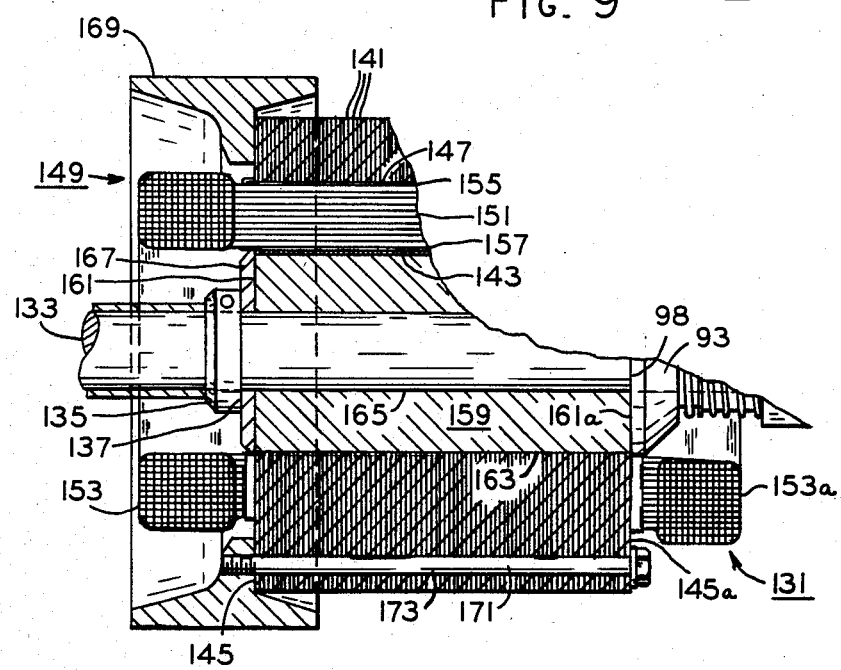
FIG. 10 is a partial sectional view generally the same as FIG. 6 but showing the stator associated with a bolt-down plate in one form of the invention.

It is, of course, contemplated that loose wound stator 131 may be associated in bolt-down relation to a ring 169 by a plurality of through bolts 171 extending through a plurality of through bolt holes 173 provided in core 139, as shown in FIG. 10, and releasably secured in the preselected position thereof on shaft 133 generally in the same manner discussed hereinabove within the scope of the invention so as to meet at least some of the objects thereof. If a more detailed discussion of the aforementioned bolt-down operation and its effect on stator 131 is desired, reference may be had to the aforementioned application Ser. No. 563,766 and also U.S. Pat. No. Re. 26,788 issued Feb. 10, 1970 to Bobbie B. Hull which is incorporated by reference herein. Furthermore, it is contemplated that stators other than of the loose wound type or bolted-down type, such as for instance a stator having its laminations held together in surface-to-surface engagement by suitable means, such as welding, staking, clinching or the like for instance as well known to the art, may be employed within the scope of the invention so as to meet at least some of the objects thereof.

With reference once again to the drawings in general and recapitulating at least in part with respect to the foregoing, there is shown in one form of the invention a method of releasably securing clamping device 61 in its clamping position about shaft 133 (FIGS. 1-9). Clamping device 61 includes a pair of means, such as wedge and slide sleeves 16, 63 or the like for instance, adapted for relative movement, means, such as bore 65 or the like for instance, in relatively movable means or slide sleeve 63 for receiving shaft 133, split compression means, such as compressible split ring 69 or the like for instance, operable generally for gripping in engagement generally about the shaft and having opposite end sections 71, 73, and wedge surfaces 13, 15 on relatively movable means or wedge sleeve 19 (FIGS. 1-6). In practicing this method, clamping device 61 is placed on shaft 133, and the shaft is received in receiving means or bore 65 of slide sleeve 63 (FIG. 7). A force is exerted on wedge sleeve 19, and thereby the relative movement of the wedge sleeve and slide sleeve 63 is effected toward the clamping position of clamping device 61 (FIG. 8). Wedge surfaces 13, 15 on wedge sleeve 19 are moved into wedging engagement with opposite end sections 71, 73 of split compression ring 69 in response to the relative movement of the wedge sleeve and slide sleeve 63, and thereby the operation of the split compression ring is effected into the gripping engagement thereof about shaft 133 to releasably secure clamping device 61 in its clamping position about the shaft (FIG. 9).

From the foregoing, it is now apparent that a novel wedge device 17, a novel clamping device 61, a novel method of adjusting a wedge angle of a wedge device, a novel method of releasably securing a clamping device with an arbor, and a novel method of releasably securing a stator in a preselected position on an arbor have been presented meeting the objects set out hereinbefore, as well as others; and it is contemplated that changes as to the precise arrangements, shapes, details and connections of the components associated with such wedge device, such clamping device and such methods, as well as the precise order of the steps of such methods, may be made by those having ordinary skill in the art without departing from either the spirit of the invention or the scope thereof as defined by the claims which follow.

What I claim as new and desire to secure by Letters Patent of the United States is:

1. A method of releasably securing a stator for a dynamoelectric machine against axial displacement on an arbor therefor, the arbor including a stop thereon, a generally annular cylindric sleeve having a pair of opposite circumferential surfaces and with a flange extending beyond the outer circumferential surface, the stator including a core having a pair of opposite end faces with a generally axial bore interposed therebetween, and a clamping device for gripping the arbor and including resiliently urged means for exerting a force on the core, the method comprising the steps of:

arranging the core and the sleeve generally in coaxial relation and engaging at least a part of the outer circumferential surface of the sleeve with the bore of the core;

seating one of the opposite end faces of the core against the flange on the sleeve;

placing the sleeve generally in coaxial relation with the arbor when the sleeve and the core are in the coaxial relation thereof and engaging the inner circumferential surface of the sleeve about the arbor;

abutting one of the opposite end portions on the sleeve with the stop on the arbor and retaining thereby the stator against axial displacement in one direction on the arbor;

disposing the clamping device about the arbor generally adjacent the other of the opposite end portions of the sleeve and engaging the resiliently urged means with the other of the opposite end faces of the core generally about the bore therein; and biasing the resiliently urged means between the other opposite end faces of the core and the clamping device thereby to maintain the one opposite end face of the core seated against the flange on the sleeve and the one opposite end portion of the sleeve abutted with the stop on the arbor and gripping the clamping device in place about the arbor thereby to retain the core against axial displacement in another direction opposite the one direction on the arbor.

2. A method of releasably securing a stator for a dynamoelectric machine generally against axial displacement from a preselected position on a mounting arbor therefor, the mounting arbor including means for defining the preselected position of the stator, and a generally annular cylindric sleeve with means thereon for seating the stator, the method comprising the steps of:

arranging the stator, the sleeve and the mounting arbor generally in coaxial relation with each other with the sleeve being interposed between the stator and the mounting arbor;

engaging the stator with the seating means therefor on the sleeve and abutting the sleeve with the defining means on the mounting arbor during the arranging step thereby to locate the stator in the preselected position thereof and retain the stator against axial displacement in one direction on the mounting arbor; and exerting a resilient force on the stator generally in the one direction to maintain the engagement of the stator with the seating means on the sleeve and the abutment of the sleeve with the defining means on the mounting arbor and retaining thereby the stator against axial displacement movement in another direction opposite the one direction on the mounting arbor.

3. The method as set forth in claim 2 wherein the mounting arbor further includes a releasable clamping device having resilient means for exerting the resilient force and wherein the exerting and retaining step includes gripping the clamping device in releasable engagement generally about the mounting arbor and biasing the resilient means against the stator.

4. The method as set forth in claim 2 wherein the stator includes a bore and the sleeve has inner and outer circumferential surfaces, and wherein the arranging step includes inserting at least a part of the outer circumferential surface of the sleeve into engagement with the bore of the stator and sliding the inner circumferential surface of the sleeve about the mounting arbor.

5. The method as set forth in claim 4 wherein the seating means extends beyond the outer circumferential surface of the sleeve at least adjacent an end portion thereof and wherein the engaging and abutting step includes placing the stator against the seating means generally about the bore in the stator and positioning the end portion of the sleeve against the defining means on the mounting arbor.

6. The method as set forth in claim 5 wherein the mounting arbor further includes a releasable clamping device having resilient means for exerting the resilient force and wherein the exerting and retaining step includes gripping the clamping device in engagement with the mounting arbor generally adjacent the stator in its preselected position on the mounting arbor and biasing the resilient means in engagement with the stator thereby to retain the stator against axial displacement in another direction opposite the one direction from the preselected position thereof on the mounting arbor.

7. A method of releasably securing a stator for a dynamoelectric machine in a preselected position on a means for mounting the stator with the mounting means including a releasable clamping device having resilient means thereon for exerting a force, the method comprising the steps of:
arranging the stator generally in coaxial relation with the mounting means and supporting the stator in the preselected position thereof on the mounting means against axial movement thereon in one direction; and
associating the clamping device in releasable gripping engagement with the mounting means and compressing the resilient means between the clamping device and the stator to exert the force against the stator thereby to retain the stator generally against axial displacement in another direction opposite the one direction from the preselected position thereof in the mounting means.

8. The method as set forth in claim 7 comprising a generally annular cylindric sleeve and wherein the arranging and supporting step includes engaging the sleeve generally coaxially between the stator and the mounting means and seating the sleeve generally in axial engagement with both the stator and the mounting means thereby to define the preselected position of the stator.

9. The method as set forth in claim 7 wherein the associating and compressing step includes predeterminately limiting the magnitude of the force exerted by the resilient means against the stator.

10. A method of releasably securing a clamping device in a clamping position on an arbor therefor, the clamping device including a pair of sleeves, a pair of bores in the sleeves with one of the sleeves being in part slidably received in one of the bores of the other of the sleeves, a split compression ring disposed at least in part generally about the other of the bores in the one sleeve, a pair of opposite end sections on the split compressive ring extending exteriorly of the one sleeve, and a pair of generally opposed wedge surfaces on the other sleeve at least adjacent the one bore therein, the method comprising the steps of:
placing the clamping device on the arbor;
sliding the other bore in the one sleeve in engagement about the arbor and receiving thereby the arbor through the split compression ring disposed about the other bore in the one sleeve during the placing step;
exerting a force on at least one of the one and other sleeves and effecting thereby relative movement of the sleeves toward the clamping position of the clamping device on the arbor;
moving the wedge surfaces on the other sleeve into wedging engagement with the opposite end sections of the split compression ring during the exerting and effecting step; and
gripping the split compression ring in engagement generally about the arbor in response to the wedging engagement of the wedge surfaces on the other sleeve with the opposite end sections of the split compression means during the moving step and releasably securing thereby the clamping device in the clamping position thereof on the arbor.

11. The method as set forth in claim 10 wherein the clamping device further includes resiliently urged means adapted for caged engagement on the one sleeve and with the arbor having a work piece thereon and wherein the exerting and effecting step includes biasing the resiliently urged means against the work piece on the arbor.

12. The method as set forth in claim 10 wherein the clamping device further includes a spring engaged between the sleeves and wherein the exerting and effecting step further includes compressing the spring.

13. The method as set forth in claim 10 wherein the clamping device further includes an abutment on the one sleeve and a detent associated with the other sleeve and wherein the method comprises the additional step of locking the detent in engagement with the abutment when the split compression ring is gripped generally about the arbor.

14. A method of releasably securing a clamping device in a clamping position on an arbor therefor, the clamping device including a pair of means adapted for relative movement and arranged at least in part generally in telescoping relation with each other, means in at least one of the relatively movable means for receiving the arbor, a split compression ring associated with the at least one relatively movable means within the receiving means thereof and having a pair of opposite end sections extending exteriorly of the at least one relatively movable means, and a pair of wedge surfaces on the other of the relatively movable means the method comprising the steps of:
placing the clamping device on the arbor;
disposing the receiving means in the at least one relatively movable means generally about the arbor and extending the arbor through the split compression ring associated with the at least one relatively movable means within the receiving means thereof during the placing step;

effecting the relative movement of the relatively movable means on the arbor toward the clamping position of the clamping device and moving thereby the wedge surfaces on the other relatively movable means into wedging engagement with the opposite end sections of the compression ring associated with the at least one relatively movable means; and displacing the split compression ring into gripping engagement generally about the arbor in response to the wedging engagement of the wedge surfaces with the opposite end sections of the split compression during the effecting and moving step and releasably securing thereby the clamping device in the clamping position thereof on the arbor.

15. The method as set forth in claim 14 wherein the clamping device further includes resiliently urged means adapted for support in caged relation on the at least one relatively movable means and with the arbor having a work piece disposed thereof, and wherein the effecting and moving step includes biasing the resiliently urged means against the work piece at least upon the relative movement of the relatively movable means.

16. The method as set forth in claim 14 wherein the clamping device further includes resilient means for engagement between the relatively moveable means and wherein the effecting and moving step further includes compressing the resilient means between the relatively movable means at least upon the relative movement thereof.

17. The method as set forth in claim 14 wherein the effecting and moving step includes exerting a force on the other relatively movable means and urging thereby the clamping device toward its clamping position on the arbor.

18. The method as set forth in claim 14 comprising the additional step of releasably interlocking the relatively movable means when the clamping device is releasably secured in the clamping position thereof.

19. A method of releasably securing a clamping device in a clamping position about an arbor, the clamping device including a pair of means adapted for relative movement, means in at least one of the resiliently urged means for receiving the arbor, split compression means associated with the receiving means and operable generally for gripping in engagement generally about the arbor and with the split compression means having a pair of opposite end sections, and a pair of wedge surfaces on the other of the relatively movable means, the method comprising the steps of:

placing the clamping device on the arbor and receiving the arbor in the receiving means therefor in the at least one relatively movable means;

exerting a force on one of the at least one relatively movable means and the other relatively movable means and effecting thereby the relative movement of the relatively movable means toward the clamping position of the clamping device; and moving the wedge surfaces on the other relatively movable means into wedging engagement with the opposite end sections of the split compression means in response to the exerting and effecting step, respectively, and effecting thereby the operation of the clamping means into the gripping engagement thereof generally about the arbor to releasably secure the clamping device in its clamping position about the arbor.

20. The method as set forth in claim 19 comprising the additional step of releasably interlocking the relatively movable means when the clamping device is releasably secured in the clamping position thereof.

21. The method as set forth in claim 19 wherein the moving and effecting step includes wedging toward each other the opposite end sections of the split compression means in response to the wedging engagement of the wedge surfaces with the opposite end sections of the split compression means and compressing thereby the split compression means into the gripping engagement thereof generally about the arbor.

22. The method as set forth in claim 19 wherein the clamping device further includes resiliently urged means for support in caged relation on the at least one relatively movable means and with the arbor having a work piece located thereon and wherein the exerting and effecting step includes biasing the resiliently urged means against the work piece.

23. The method as set forth in claim 22 wherein the biasing step includes predeterminately limiting the transmission to the work piece through the resiliently urged means of the force exerted on the one of the at least one relatively movable means and the other relatively movable means.

24. The method as set forth in claim 19 wherein the clamping device further includes resilient means for biasing engagement between the relatively movable means and wherein the exerting and effecting step includes compressing the resilient means at least during the movement of the one of the at least one relatively movable means relative to the other of the at least one relatively movable means and the other relatively movable means.

25. A method of adjusting a wedge angle between a pair of wedge surfaces in a wedge device, the wedge device including a housing having a bifurcated wall section thereof spaced generally in opposed relation with another wall of the housing, the wedge surfaces being defined in opposed relation on the bifurcated wall section and the another wall, the bifurcated wall section having a free end portion and another end portion opposite thereto and integral with the housing, a pair of stepped passages in the housing with the larger of the stepped passages being threaded, an adjusting pin, and an adjusting screw, the method comprising the steps of:

inserting the adjusting pin into the smaller of the stepped passages and threadedly engaging the adjusting screw in the threaded larger stepped passage;

threadedly adjusting the adjusting screw in the threaded larger stepped passage and adjustably moving thereby the adjusting pin through the smaller stepped passage; and driving an end portion of the adjusting pin in wedging engagement between the free end portion of the bifurcated wall section and a confronting part of the housing adjacent thereto in response to the threadedly adjusting and adjustably moving step and displacing thereby the bifurcated wall section generally about the another end portion thereof toward the another wall of the housing thereby to adjust the wedge angle between the wedge surfaces on the bifurcated wall section and the another wall of the housing, respectively.

26. A method of adjusting a wedge angle between a pair of wedge surfaces in a wedge device, the wedge device including a housing, a pair of opposed walls in the housing with at least one of the walls having a bifurcated wall section and with the bifurcated wall section having a free end portion and another end portion opposite thereto integral with the housing, and at least one adjusting device, the method comprising the steps of:
wedging the at least one adjusting device in engagement between the bifurcated wall section at least generally adjacent the free end portion thereof and a confronting part of the housing adjacent the bifurcated wall section;
adjustably moving the at least one adjusting device in the wedging engagement thereof between the bifurcated wall section and the confronting housing part and levering thereby the bifurcated wall section generally about the another end portion thereof toward an adjusted position with respect to the other of the opposed walls; and
adjusting the wedge angle between the wedge surfaces defined on the bifurcated wall section and the other opposed wall of the housing in response to the adjustably moving and levering step.

27. A method of adjusting a wedge angle between a pair of wedge surfaces in a wedge device, the wedge device including a housing, a pair of opposed walls in the housing with at least one of the opposed walls having a bifurcated wall section, the other of the opposed walls and the bifurcated wall section defining the wedge surfaces, and an adjusting device, the method comprising the steps of:
drivingly engaging the adjusting device with a part of the bifurcated wall section and deflecting thereby the bifurcated wall section with respect to the other opposed wall so as to adjust the wedge angle between the wedge surfaces defined on the other opposed wall and the bifurcated wall section, respectively.

28. A clamping device comprising:
a generally annular cylindric first sleeve including a pair of first opposite end portions, first inner and outer circumferential surfaces on said first sleeve intersecting with said first opposite end portions thereof, respectively, a groove in said first sleeve extending about said first outer circumferential surface adjacent one of said first opposite end portions, and a first slot in said first sleeve extending generally axially between said first opposite end portions and intersecting with said first inner and outer circumferential surfaces, said one first opposite end portion and said groove;
a split compression ring disposed generally about a part of said first inner circumferential surface of first said sleeve and including a pair of spaced apart opposite end sections extending through said first slot beyond said first outer circumferential surface of said first sleeve, respectively;
a stop disposed within said groove of said first sleeve and extending beyond said first outer circumferential surface thereof; and
a second sleeve reciprocally movable with respect to said first sleeve and including a pair of second opposite end portions, second inner and outer circumferential surfaces on said second sleeve interposed between said second opposite end portions thereof, respectively, said second inner circumferential surface of said second sleeve being slidably received at least in part on said first outer circumferential surface of said first sleeve at least adjacent said one first opposite end portion thereof, a second slot in said second sleeve intersecting with both one of said second opposite end portions and said second inner and outer surfaces thereof, said second slot having a pair of opposed wall means on said second sleeve for wedging engagement with said opposed end sections of said split compression ring to effect the compression thereof within said first inner circumferential surface of said first sleeve upon the reciprocal movement of said second sleeve in one direction with respect to said first sleeve, at least a part of one of said opposed wall means of said second slot being disposed in angular relation with the other of said opposite wall means thereof, and means connected with said second sleeve and movable in part through said second slot for locking in releasable engagement with said stop on said first sleeve thereby to retain said second sleeve against reciprocal movement in another direction opposite the one direction with respect to said first sleeve.

29. A clamping device as set forth in claim 28 further comprising resilient means biased between said first and second sleeves for opposing the reciprocal movement of said second sleeve in the one direction with respect to said first sleeve.

30. A clamping device as set forth in claim 28 further comprising resiliently urged means retained in caged relation on said first sleeve at least adjacent the other of said first opposite end portions thereof.

31. A clamping device as set forth in claim 30 wherein said first sleeve further includes a pair of spaced apart abutments extending beyond said first outer circumferential surface, and said resiliently urged means including a force transmitting member disposed about said first outer circumferential surface of said first sleeve between said spaced apart abutments thereon, and resilient means biased between one of said spaced apart abutments and said force transmitting means for urging it toward engagement with the other of said spaced apart abutments on said first sleeve.

32. A clamping device as set forth in claim 28 wherein said first and second sleeves further include means operable generally for defining a lost motion engagement therebetween to limit the reciprocal movement of said second sleeve with respect to said first sleeve.

33. A clamping device as set forth in claim 28 wherein said at least one wall means part of said second slot is pivotally movable toward an adjusted position with respect to said other wall means thereof to establish the angular relation between said at least one wall means part and said other wall means and thereby control the intensity of the wedging engagement of said at least one wall means part and said other wall means with said opposite end sections of said split compression ring, respectively.

34. A clamping device as set forth in claim 33 wherein said second sleeve further includes means adjustably movable therein and associated with said at least one wall part for adjusting the adjusted position thereof with respect to said other wall means of said second slot.

35. A clamping device comprising:
a pair of means adapted for relative movement, at least one of said relatively movable means including a bore therein, and an aperture extending through said at least one relatively movable means intersecting with said bore therein;
compression means disposed in part within said bore of said at least one relatively movable means and operable generally for compressive movement with respect thereto, said compression means including a pair of opposite end sections extending through said aperture exteriorly of said at least one relatively movable means, respectively; and the other of said relatively movable means including means for wedging engagement with said opposite end sections of said compression means to effect the compressive movement thereof with respect to said at least one relatively movable means in response to the movement of said other relatively movable means relative to said at least one relatively movable means.

36. A clamping device comprising:

a pair of relatively movable members arranged in part generally in telescoping relation, said members including a pair of bores, a pair of apertures in said members intersecting with said bores and arranged at least in part in both axial and radially aligned relation, respectively;

compressible clamping means for disposition in part within one of said bores of one of said members and including a pair of opposed end sections extending through at least one of said apertures in one of said members; and the other of said apertures in the other of said members including a pair of opposed wall means for wedging engagement with said opposed end sections of said compressible clamping means to effect the compression of at least said part thereof within said one bore of said one member upon the relative movement of said members.

37. A clamping device as set forth in claim 36 further comprising resilient means for biasing engagement between said members.

38. A clamping device as set forth in claim 36 further comprising resiliently urged means contained in caged relation on said one member.

39. A clamping device as set forth in claim 36 wherein said members further include means for limiting the relative movement thereof.

40. A clamping device as set forth in claim 36 wherein at least one of said opposed wall means of said other aperture in said other member includes a part deformable toward an adjusted position with respect to the other of said opposed wall means of said one aperture in said other member thereby to adjust the intensity of the wedging engagement of said at least one opposed wall means part and said other opposed wall means with said opposed end sections of said compressible clamping means, respectively.

41. A clamping device as set forth in claim 40 wherein said other member further includes means adjustably movable therein and associated with said at least one opposed wall means part for adjustably deforming it to establish its adjusted position with respect to said other opposed wall means of said other aperture in said other member.

42. A clamping device as set forth in claim 36 wherein said other member further includes means movable in part within said other aperture for locking in engagement with a part of said one member upon the relative movement of said members.

43. A wedge device comprising:

a housing having a pair of opposite end portions interposed between an inner circumferential surface and an outer circumferential surface of said housing, respectively;

a slot in said housing including a pair of opposed sidewalls intersecting with one of said opposite end portions and with said inner and outer circumferential surfaces of said housing, said opposed sidewalls defining at least in part a pair of opposed wedge surfaces, and a cross wall interposed between said opposed sidewalls and intersecting with said inner and outer circumferential surfaces of said housing, respectively;

a cross slot in said housing intersecting with said inner and outer circumferential surfaces and with one of said opposed sidewalls of said first named slot generally adjacent said cross wall thereof, respectively;

another slot in said housing spaced adjacent said one opposite sidewall of said first named slot and intersecting with said inner and outer circumferential surfaces of said housing and with said cross slot, respectively, said another slot and said cross slot defining a bifurcated wall section on said housing including a part of said one opposed sidewall of said first named slot;

a pair of stepped passages in said housing and arranged generally in aligned relation with said another slot, the smaller of said stepped passages intersecting with said cross slot and the larger of said stepped passages intersecting with the other of said opposite end portions of said housing, and said larger stepped passage being at least in part threaded;

an adjusting pin slidable in said smaller stepped passage and including a wedge end extending into said another slot in wedging engagement between said bifurcated wall section and a confronting part of said housing adjacent thereto, and an abutment end opposite said wedge end extending into said larger stepped passage; and an adjusting screw engaged with said threads of said larger stepped passage and associated in driving engagement with said abutment end of said adjusting pin, said adjusting screw being threadedly adjustably movable in said larger stepped passage to drive said wedge end of said adjusting pin in the wedging engagement thereof between said bifurcated wall section and said confronting part of said housing thereby to deflect said bifurcated wall section and adjust the wedge angle between the wedge surfaces defined on said one opposed sidewall part and the other of the opposed sidewalls of said first named slot, respectively.

44. A wedge device comprising:

a housing;

a wall in said housing defining a wedge surface;

a bifurcated wall section in said housing defining another wedge surface arranged generally in spaced apart opposing relation with said first named wedge surface on said wall of said housing, said bifurcated wall section including a free end portion and another end portion generally opposite said free end portion and integral with said housing; and adjusting means adjustably movable in said housing and engaged with said bifurcated wall section at least adjacent said free end portion thereof for displacing said bifurcated wall section generally about said another end portion thereof thereby to adjust a wedge angle between said first named and another wedge surfaces.

45. A wedge device comprising:

a housing;

a wall on said housing defining a wedge surface;

a bifurcated wall section in said housing defining another wedge surface disposed generally in spaced apart opposed relation with said first named wedge surface; and adjusting means movable in said housing for deflecting said bifurcated wall section thereby to adjust a wedge angle between said first named and another wedge surfaces, respectively.

* * * * *